United States Patent
Ho et al.

(10) Patent No.: US 7,540,969 B2
(45) Date of Patent: Jun. 2, 2009

(54) HIGH THERMAL CONDUCTING CIRCUIT SUBSTRATE AND MANUFACTURING PROCESS THEREOF

(75) Inventors: Chung W. Ho, Taipei (TW); Leo Shen, Hsinchu (TW)

(73) Assignee: Subtron Technology Co., Ltd., Hsinchu (TW)

( * ) Notice: Subject to any disclaimer, the term of this patent is extended or adjusted under 35 U.S.C. 154(b) by 0 days.

(21) Appl. No.: 11/565,836

(22) Filed: Dec. 1, 2006

(65) Prior Publication Data
US 2007/0126093 A1    Jun. 7, 2007

(30) Foreign Application Priority Data
Dec. 6, 2005    (TW)    .............................. 94142906 A

(51) Int. Cl.
*H01B 13/00*    (2006.01)
(52) U.S. Cl. .............................. 216/17; 216/18; 216/19; 216/76; 216/78
(58) Field of Classification Search ................... 216/17, 216/18, 19, 76, 78
See application file for complete search history.

(56) References Cited

U.S. PATENT DOCUMENTS

| | | | | |
|---|---|---|---|---|
| 5,776,817 A | * | 7/1998 | Liang | .......................... 438/427 |
| 6,033,588 A | * | 3/2000 | Yu | .............................. 216/72 |
| 2003/0040138 A1 | * | 2/2003 | Kobayashi et al. | .......... 438/112 |
| 2003/0203623 A1 | * | 10/2003 | Coomer | ...................... 438/667 |
| 2006/0231853 A1 | * | 10/2006 | Tanaka et al. | .................. 257/99 |

* cited by examiner

*Primary Examiner*—Binh X Tran
(74) *Attorney, Agent, or Firm*—J.C. Patents

(57) ABSTRACT

A manufacturing process of a high thermal conducting circuit substrate is provided. First, a metal core substrate is provided and then the metal core substrate is etched at different etching speeds. Afterwards, two insulating layers are formed respectively on two sides of the etched metal core substrate. In addition, as an option, two conducting layers are formed respectively on two sides of the metal core substrate and are on top of the insulting layers. The conducting layers are patterned according to designs appropriate for the products. Because the high thermal conducting circuit substrate fabricated as the aforementioned manufacturing process mainly comprises the metal core substrate, it helps to elevate the thermal conduction of the circuit substrate itself.

17 Claims, 5 Drawing Sheets

HIGH THERMAL CONDUCTING CIRCUIT SUBSTRATE AND MANUFACTURING PROCESS THEREOF

CROSS-REFERENCE TO RELATED APPLICATION

This application claims the priority benefit of Taiwan application Ser. No. 94142906, filed Dec. 6, 2005. All disclosure of the Taiwan application is incorporated herein by reference.

BACKGROUND OF THE INVENTION

1. Field of the Invention

The present invention is related to a circuit substrate, especially to a high thermal conducting circuit substrate and a manufacturing process thereof.

2. Description of Related Art

In the field of chip packaging technologies, as the thermal generation of chips keeps raising, the carrier, for example, the leadframe or package substrate used for carrying chips, needs to have good thermal dissipation efficiency to lower the temperature of the chips during operation.

Taking the conventional Quad Flat No-lead (QFN) type package as an example, which utilizes a 5-mil-thick copper plate, and patterns the copper plate by etching to form a plurality of bonding pads. Some of the bonding pads are used for chip bonding, while another part of the bonding pads is used for wire bonding. Signal I/O pads on an active surface of the chip are electrically connected with the wire bonding pads through a plurality of wires respectively.

During the process of the QFN type package, a plastic molding process is carried out to form a molding compound encapsulating the chip and the wires and exposing the bottom surfaces of the bonding pads on the bottom of the package after bonding chips to the chip bonding pads and connecting the wire bonding pads with the I/O pads of the chips through the wires. The exposed bottom surfaces of the bonding chips can be directly soldered to a Print Circuit Board (PCB). Thus, the thermal generated during the operation of the chips can be transmitted to the PCB through the chip bonding pads. Hence, in the application of high thermal chip packaging, QFN type packaging body is conducive to transmitting the heat produced by the chips to the PCB, and the molding compound can also completely seal the chips and the circuits.

Additionally, for the package of LED chips, the top of the package has to be open so as to emit the light from the LED chips. Although the QFN type package has a shorter signal transmission path, but the top of the QFN type package is not open for the light penetration, which is why it is hard to apply the QFN type package on LED chips.

SUMMARY OF THE INVENTION

The present invention is directed to a manufacturing process of a high thermal conducting circuit substrate which mainly comprises a metal core substrate.

The present invention is further directed to a high thermal conducting circuit substrate which provides higher thermal conducting efficiency to high power electronic elements disposed thereon.

As embodied and broadly described herein, the invention provides a structure and a manufacturing process of the high thermal conducting circuit substrate, comprising: providing a metal core substrate; etching the metal core substrate at a plurality of different etching speeds; and respectively forming an insulating layer on the two sides of the etched metal core substrate.

According to the manufacturing process of the high thermal conducting circuit substrate described in embodiments of the present invention, the steps of etching the said metal core substrate may include: forming a patterned etching mask respectively on the two sides of the metal core substrate, wherein each etching mask has a plurality of mesh areas, and one of these mesh areas has a density higher than that of another; etching the metal core substrate by an etchant through the mesh areas of the etching masks, and simultaneously controlling the depth of etching on the metal core substrate by controlling the density of meshes in the mesh areas; and removing the etching masks from the metal core substrate.

According to the manufacturing process of the high thermal conducting circuit substrate described in the embodiments of the invention, the manufacturing process may further comprise forming respectively a conductive layer on top of a surface of each insulating layer, which is formed on the etched surface of the metal core substrate. Then, the conductive layers can be patterned.

According to the manufacturing process of the high thermal conducting circuit substrate described in the embodiments of the invention, a first surface of the metal core substrate is etched to form at least a first metal post. An end of the first metal post serves as a first bonding pad. The first bonding pad can be, for instance, a chip bonding pad, a flip chip bump pad or a wire bonding pad.

According to the manufacturing process of the high thermal conducting circuit substrate described in the embodiments of the invention, a second surface of the metal core substrate is etched at the same time when the first surface is etched to form at least a second metal post. An end of the second metal post serves as a second bonding pad. The second bonding pad can be, for instance, a power supply pad, a ground pad or a signal pad.

According to the manufacturing process of the high thermal conducting circuit substrate described in the embodiments of the invention, the metal core substrate is etched from both surfaces as described above, to form a first through hole, wherein the first through hole penetrates through the metal core substrate. The metal core substrate, the insulating layers and the conductive layers all constitute a laminating structure after the insulating layers and the conductive layers are formed respectively on the first surface and the second surface of the metal core substrate. The manufacturing process further comprises: forming a second through hole in the laminating structure, wherein the second through hole penetrates the laminating structure; and forming a conductive channel in the second through hole so as to electrically connect at least two layers of the groups consisted of the metal core substrate and the conductive layers.

According to the manufacturing process of the high thermal conducting circuit substrate described in the embodiments of the invention, electroplating process can be applied to form the conductive channel.

According to the manufacturing process of the high thermal conducting circuit substrate described in the embodiments of the invention, the metal core substrate is etched to form a solid metal post so as to form a first bonding pad on the first surface of the metal core substrate and a second bonding pad on the second surface of the metal core substrate.

According to the manufacturing process of the high thermal conducting circuit substrate described in the embodiments of the invention, the material of the metal core substrate can be, for example, copper, aluminum or stainless steel.

The invention further provides a high thermal conducting circuit substrate, which comprises a metal core substrate, a first insulating layer and a second insulating layer. The metal core substrate is divided into a patterned upper layer, a patterned lower layer and a middle layer stacked alternately. The middle layer is between the upper layer and lower layer. The upper layer comprises at least a first metal post, and an end of the first metal post farther from the middle layer is used as a first bonding pad. The lower layer comprises at least a second metal post, and an end of the second metal post farther from the middle layer is used as a second bonding pad. The first insulating layer is disposed on a surface of the middle layer and is complementary to the upper layer. The second insulating layer is disposed on another surface of the middle layer and is complementary to the lower layer.

According to the high thermal conducting circuit substrate described in the embodiments of the invention, the high thermal conducting circuit substrate further comprises a patterned first conductive layer disposed on a surface of the first insulating layer.

According to the high thermal conducting circuit substrate described in the embodiments of the invention, the high thermal conducting circuit substrate further comprises a patterned second conductive layer disposed on a surface of the second insulating layer.

According to the high thermal conducting circuit substrate described in the embodiments of the invention, the high thermal conducting circuit substrate further comprises a conductive channel, which penetrates through the first insulating layer, the middle layer and a second insulating layer, wherein the conductive channel electrically connects the first conductive layer and the second conductive layer, but does not electrically connect with the middle layer.

According to the high thermal conducting circuit substrate described in the embodiments of the invention, it further comprises a conductive channel, which penetrates through the first insulating layer, the metal core substrate and a second insulating layer, wherein the conductive channel electrically connects the first conductive layer, the second conductive layer, and the middle layer.

According to the high thermal conducting circuit substrate described in the embodiments of the invention, the first bonding pad can be, for instance, a chip bonding pad, a flip chip bump pad or a wire bonding pad.

According to the high thermal conducting circuit substrate described in the embodiments of the invention, the second bonding pad can be, for example, a power supply pad, a ground pad or a signal pad.

The invention further provides a high thermal conducting circuit substrate, which comprises a metal core substrate, a first insulating layer and a second insulating layer. The metal core substrate is divided into a patterned upper layer, a patterned lower layer and a middle layer stacked alternately. The middle layer is between the upper layer and the lower layer, and the middle layer comprises primarily a metal plane, some traces and some via holes. The upper layer comprises a plurality of first metal posts which connect respectively to a surface of the traces. The lower layer comprises a plurality of second metal posts which connect respectively to another surface of these traces. The first insulating layer is disposed on a surface of the middle layer and complementary to the upper layer. The first insulating layer further exposes an end of each first metal post farther from the middle layer, and the ends of the first metal posts serve as a plurality of first bonding pads. The second insulating layer is disposed on another surface of the middle layer and complementary to the lower layer. The second insulating layer further exposes an end of the second metal posts that is farther from the middle layer, and the end serves as a plurality of second bonding pads.

According to the high thermal conducting circuit substrate described in the embodiments of the invention, a first bonding pad can be, for example, a chip bonding pad, a flip chip bump pad or a wire bonding pad.

According to the high thermal conducting circuit substrate described in the embodiments of the invention, the second bonding pad can be, for instance, a power supply pad, a ground pad or a signal pad.

In view of the above, the manufacturing process of the high thermal conducting circuit substrate in the present invention etches a metal core substrate at different etching speeds so as to form two laminated layers of metal patterns, and then the negative space among the metal patterns is filled with insulating materials. Additionally, the high thermal conducting substrate of the present invention mainly comprises the metal core substrate, which helps to elevate the thermal conduction of the circuit substrate itself.

In order to make the aforementioned and other objectives, features and advantages of the present invention more comprehensible, preferred embodiment accompanied with figures are described in detail below. It is to be understood that both the foregoing general description and the following detailed description are exemplary, and are intended to provide further explanation of the invention as claimed.

DESCRIPTION OF EMBODIMENTS

Figure 1A:
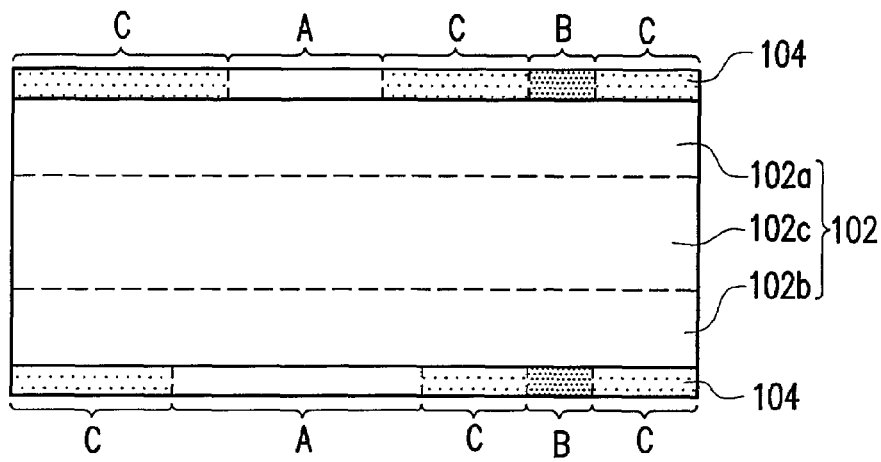
FIGS. 1A to 1F show the manufacturing process of a high thermal conducting circuit substrate according to one embodiment of the invention.

FIGS. 1A to 1F show the manufacturing process of a high thermal conducting circuit substrate according to one embodiment of the invention. Please refer to FIGS. 1A and 1B. First, a metal core substrate 102 is provided. The material of the metal core substrate may be copper, aluminum or stainless steel. In this embodiment, in order to form the through hole 106 and the metal post 108 with different etching speeds on the metal core substrate 102 as shown on FIG. 1B, a patterned etching mask 104 can be formed respectively on the two sides of the metal core substrate 102, wherein each of these etching masks 104 has a plurality of mesh area A, mesh area B and mesh area C, and the mesh densities in these mesh areas are different. Afterwards, the metal core substrate is etched by an etchant through the mesh areas A, B and C on the etching masks 104, and the depth of etching on the metal core substrate 102 is controlled simultaneously by controlling the mesh densities in the mesh areas A, B and C. Finally, the structure in FIG. 1B can be obtained after removing the etching masks 104 from the metal core substrate 102.

Figure 1B:
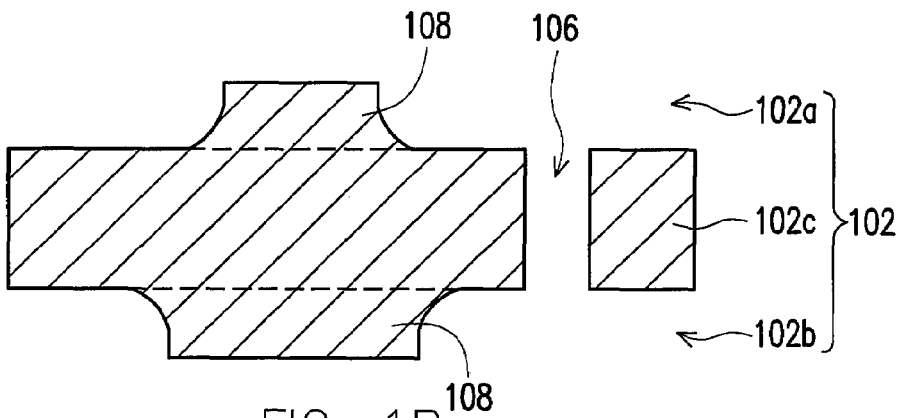

As regards the mesh areas A on the etching masks 104, it has the highest mesh density, and can be considered as having no spaces between the meshes. Therefore, the etchant flowing through this area does not etch the partial area covered by the mesh areas A on the metal core substrate 102. As to the mesh areas B on the etching masks 104, the mesh areas B have a lower mesh density, so the etchant flowing through the mesh areas B etches and penetrates the metal core substrate 102, and then the through hole 106 in turn is formed as shown in FIG. 1B. For the mesh areas C on the etching masks 104, it has a mesh density lower than that of the mesh areas A but higher than that of the mesh areas C, so the etchant flowing through the mesh areas C can only etches the upper layer 102a and the lower layer 102b, but leaves the middle layer 102c. The unetched part in the upper layer 102a together with the lower layer. 102b form some metal patterns, which include the metal posts 108, and one end of each of the metal posts 108 serves respectively as a bonding pad, for example, a chip bonding pad, a wire bonding pad, a flip chip bonding pad, a power supply pad, a ground pad or a signal pad.

In the embodiments of the present invention, when the etching masks 104 are formed on the two sides of the metal core substrate 102 by photolithography, the mesh densities of the mesh areas A, B and C on the etching masks 104 can be determined during the exposing process.

Figure 1C:
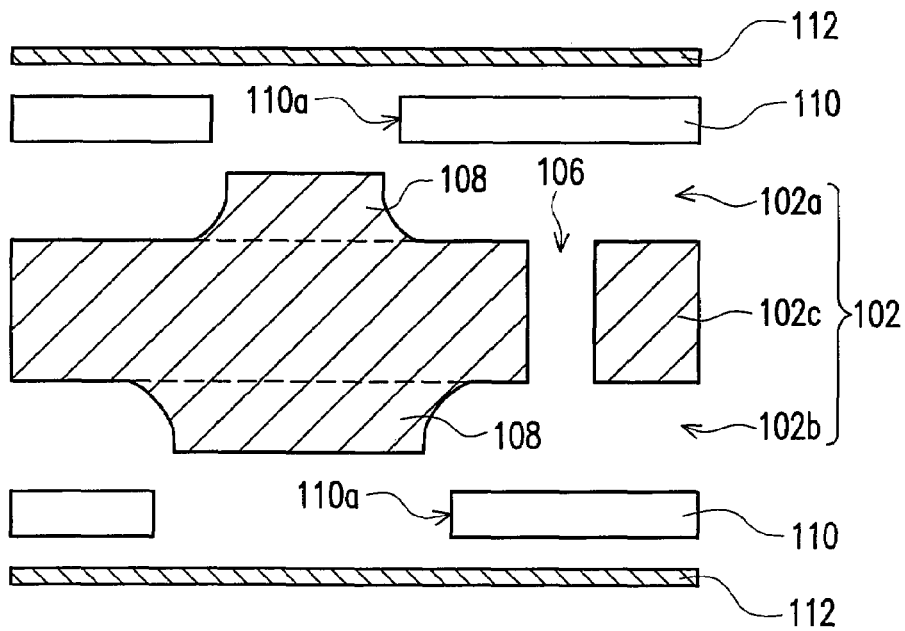
Figure 1D:
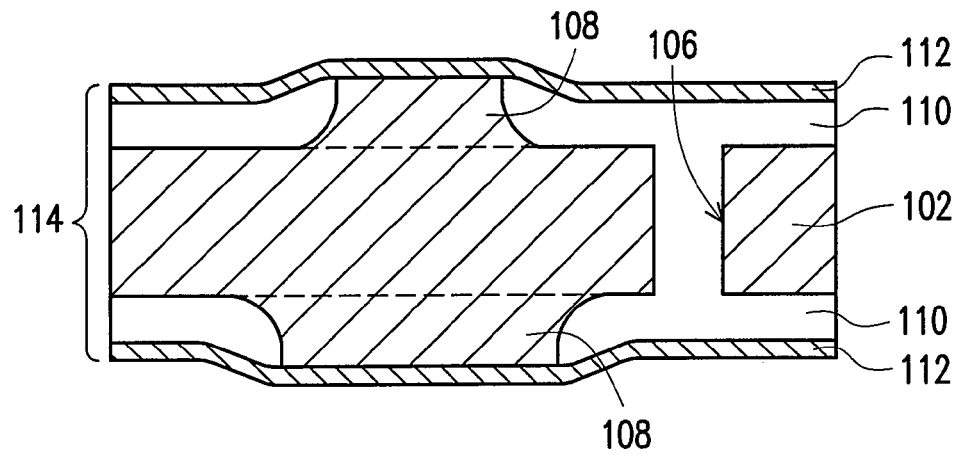

Referring to FIGS. 1C and 1D, after the metal core substrate 102 is etched as the structure in FIG. 1B, two insulating layers 110, such as two prepregs, are respectively disposed on the two sides of the metal core substrate 102 by lamination. It is noted that an opening 110a can be pre-formed on the insulating layers 110 so as to allow the insulating layers 110 respectively laminated on the two sides of the metal core substrate 102 to expose the ends of the metal posts 108.

Referring to FIG. 1C and 1D, besides disposing the insulating layers 110 on the two sides of the metal core substrate 102, the present embodiment further respectively laminates two conductive layers 112 to the two insulating layers 110 while laminating the two insulating layers 110 on the two sides of the metal core substrate 102. The metal core substrate 102, two insulating layers 110 and two conductive layers 112 form a laminating structure 114, as shown in FIG. 1D. Meanwhile, the material of the insulating layer 110 is filled into the through hole 106 of the metal core substrate 102.

Figure 1E:
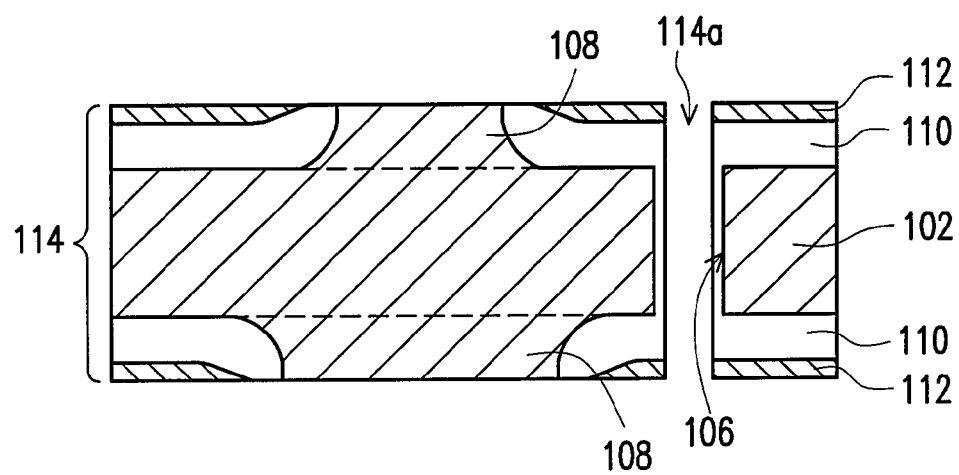

Referring to FIG. 1E, after forming the laminating structure 114 in FIG. 1D, the bulging areas on the two conductive layers 112 and two insulating layers 110 caused by metal patterns, such as the metal posts 108, are removed by grinding, so as to pattern the conductive layers 112 and make them expose the ends of the metal posts 108. Then, a through hole 114a is formed on the laminating structure 114 by means such as drilling, wherein the through hole 114a penetrates the laminating structure 114 and connects the two sides of the laminating structure 114. In another embodiment not illustrated here, the conductive layers 112 can also be patterned by etching to expose the ends of the metal posts 108.

Figure 1F:
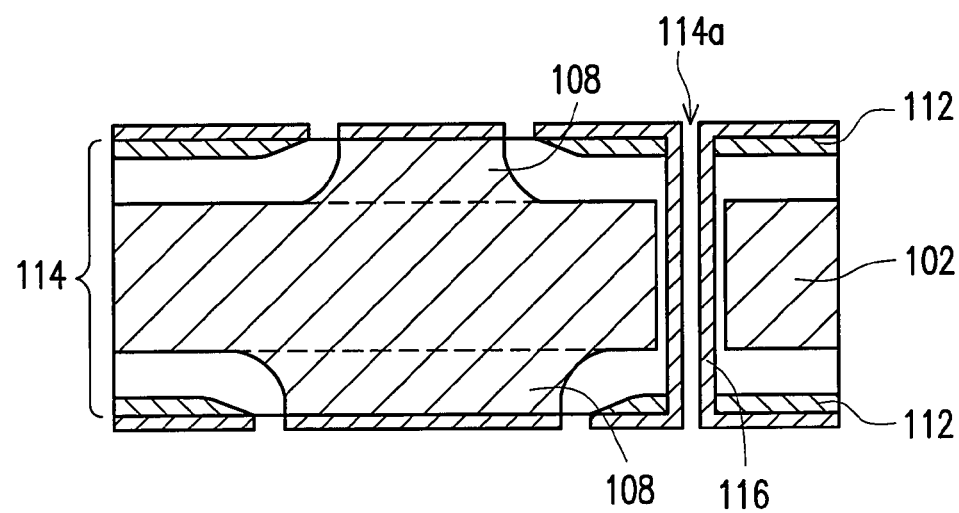

Referring to FIG. 1F, after the through hole 114a is formed on the laminating structure 114, a conductive channel 116 is formed in the through hole 114a by means such as electroplating to electrically connect the two conductive layers 112. In another embodiment not illustrated here, the through hole 114a can also penetrate through the metal core substrate 102 (i.e., the middle layer 102c in FIG. 1A) to allow the conductive channel 116 formed later inside of it to electrically connect the conductive layers 112 and the metal core substrate 102.

Figure 2A:
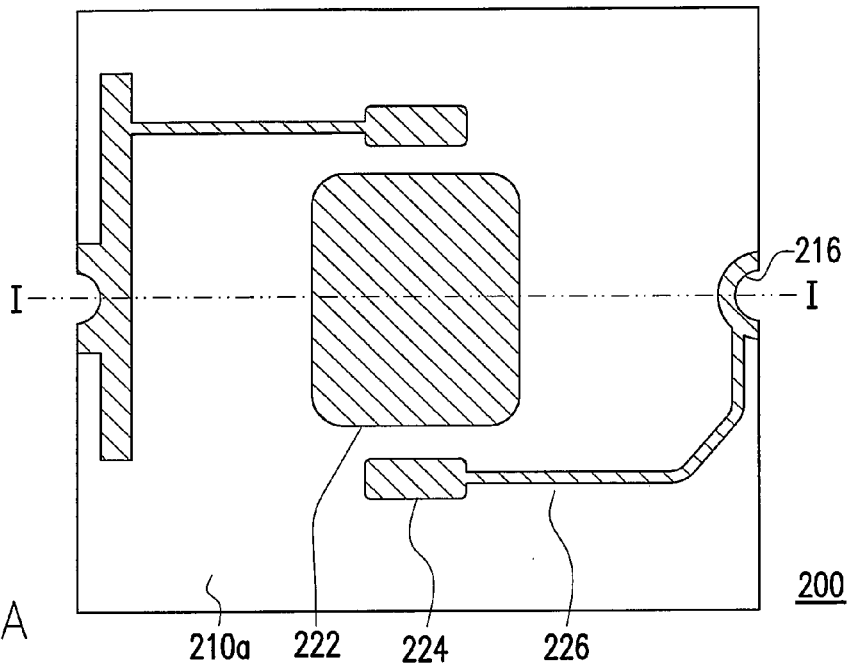
FIG. 2A is the top view of a high thermal conducting circuit substrate in one embodiment of the invention.
Figure 2B:
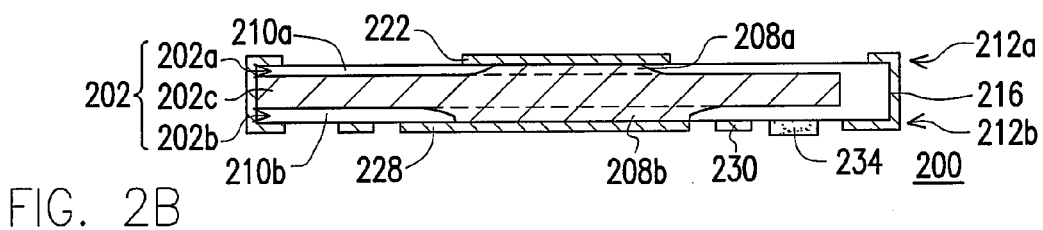
FIG. 2B is the cross-sectional view along line I-I of FIG. 2A.
Figure 2C:
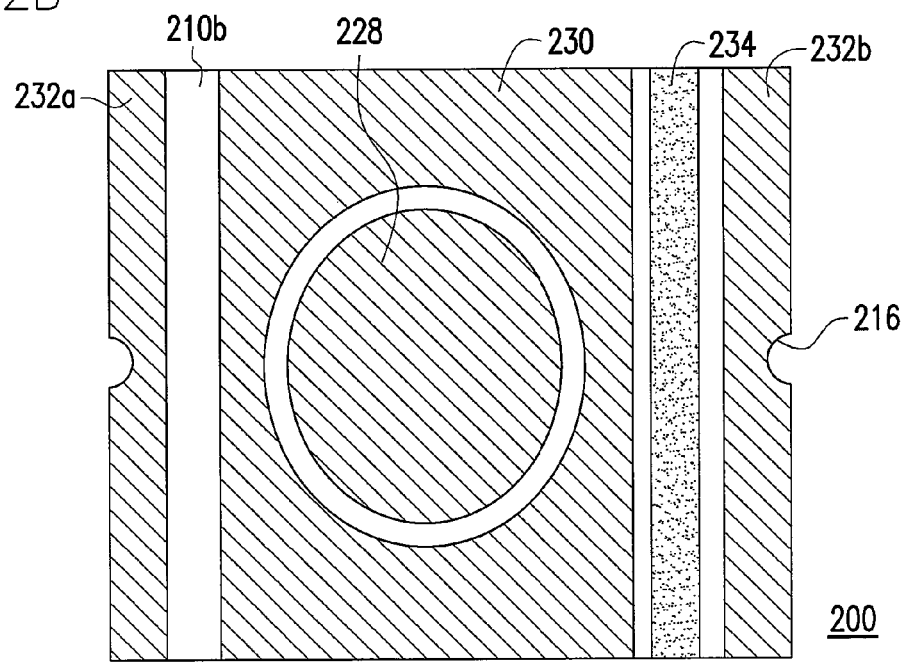
FIG. 2C is the bottom view of the high thermal conducting circuit substrate in FIG. 2A.

FIG. 2A is a top view of a high thermal conducting circuit substrate in one embodiment of the present invention. FIG. 2B is a cross-sectional view along line I-I in FIG. 2A. FIG. 2C is a bottom view of the high thermal conducting circuit substrate of FIG. 2A. Referring to FIGS. 2A to 2C, the high thermal conducting circuit substrate 200 is a type of chip carrier for wire bonding package fabricated according to the manufacturing process shown in FIGS. 1A to 1F.

The high thermal conducting circuit substrate 200 comprises a metal core substrate 202, which is divided into a patterned upper layer 202a, a patterned lower layer 202b and a middle layer 202c stacked alternately. The middle layer 202c is between the upper layer 202a and the lower layer 202b. Additionally, the high thermal conducting circuit substrate 200 further comprises an insulating layer 210a disposed on one side of the middle layer 202c and complementary to the upper layer 202a. Additionally, the high thermal conducting circuit substrate 200 further comprises another insulating layer 210b disposed on the other side of the middle layer 202c and complementary to the upper layer 202b.

The high thermal conducting circuit substrate 200 further comprises a patterned conductive layer 212a, disposed on the surface of the insulating layer 210a. The conductive layer 212a composes a chip bonding pad 222, a plurality of wire bonding pads 224 and a plurality of traces 226. Among them, the chip bonding pad 222 is disposed on the end of the metal post 208a to connect the bottom of a chip (not illustrated), and the wire bonding pads 224 on the periphery of the chip bonding pad 222 are used to electrically connect signal I/O pads on an active side of the chip through wires (not illustrated), and to respectively connect to a conductive channel 216 through the traces 212b.

The high thermal conducting circuit substrate 200 further comprises a patterned conductive layer 212b, disposed on the surface of the insulating layer 210b. The conductive layer 212b comprises a plurality of bonding pads 228, 230, 232a and 232b. Among them, the bonding pad 228 disposed on the end of the metal post 208b below is used to connect to the next level package. The bonding pad 230 is disposed on the periphery of the bonding pad 228, while the bonding pads 232a and 232b are disposed on the two sides of the bonding pad 230 and are electrically connected to the two traces 224 respectively through the conductive channel 216. Moreover, a solder mask 234 between the bonding pads 230 and 232b is used to prevent solder from extending to the space between the bonding pads 230 and 232b and electrically connecting the bonding pads 230 and 232b.

Figure 3A:
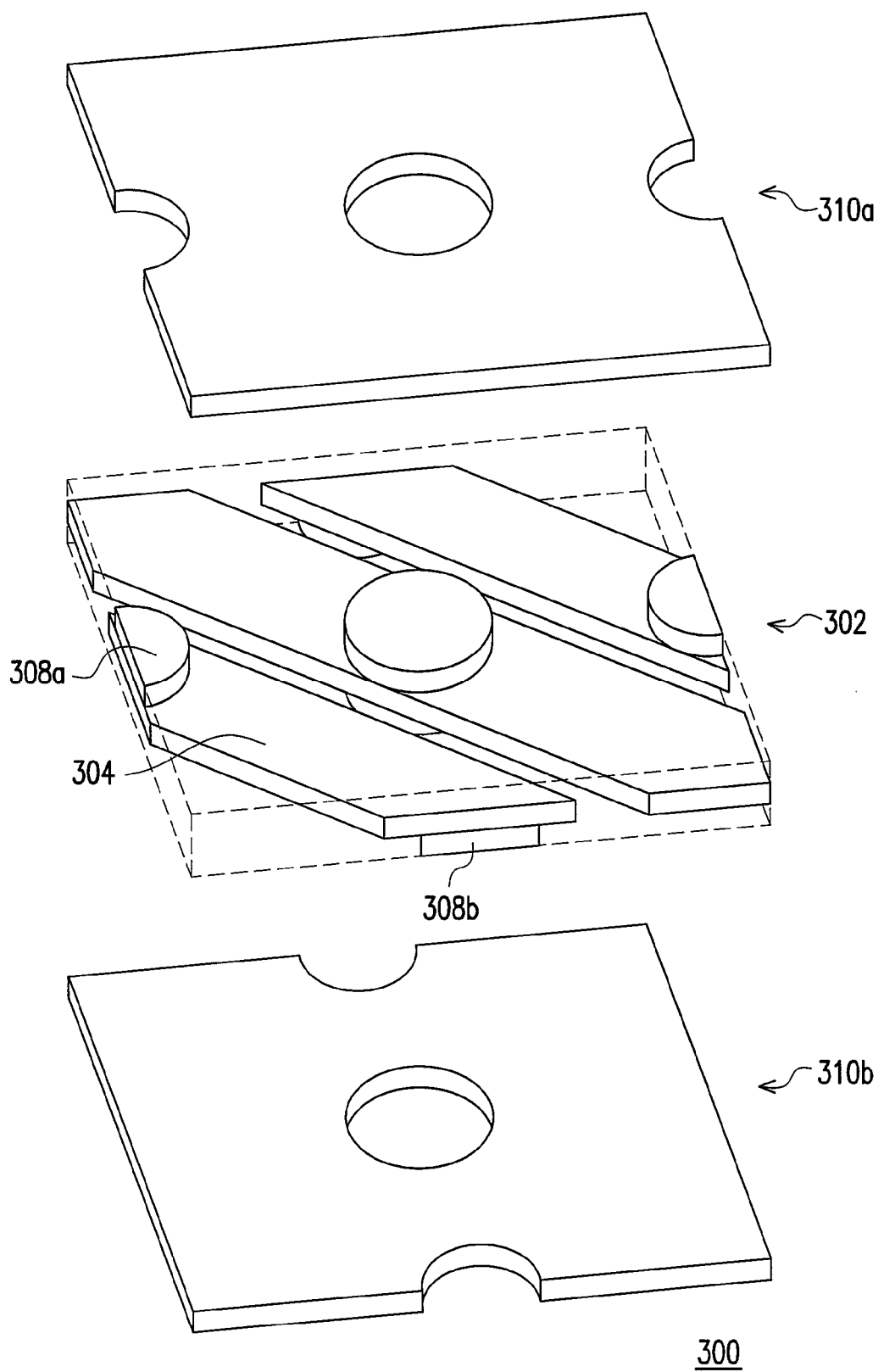
FIG. 3A is the perspective view of a high thermal conducting circuit substrate in another embodiment of the invention.
Figure 3B:
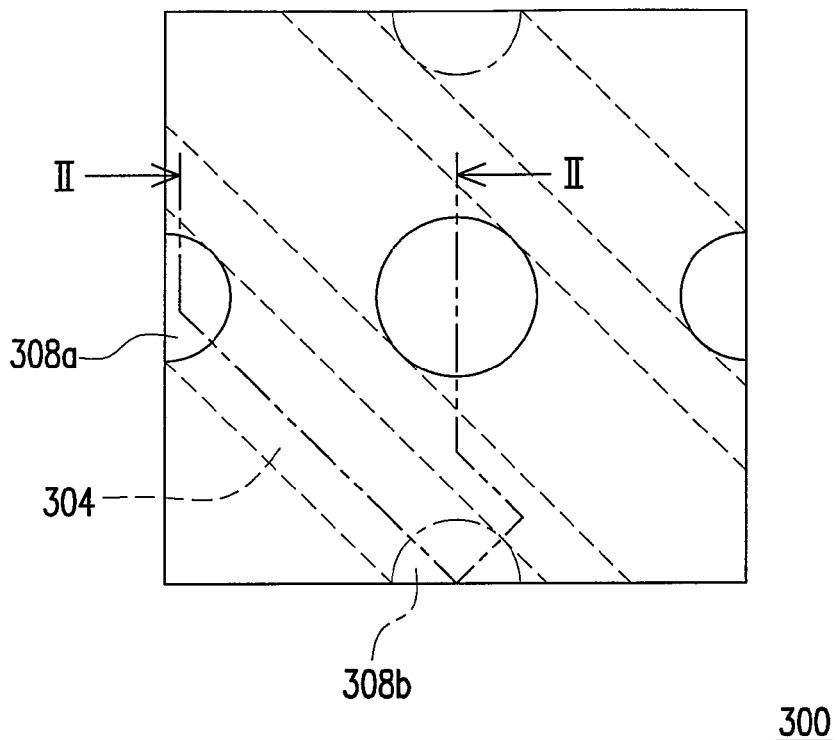
FIG. 3B is the top view of the high thermal conducting circuit substrate of FIG. 3A after being assembled.
Figure 3C:
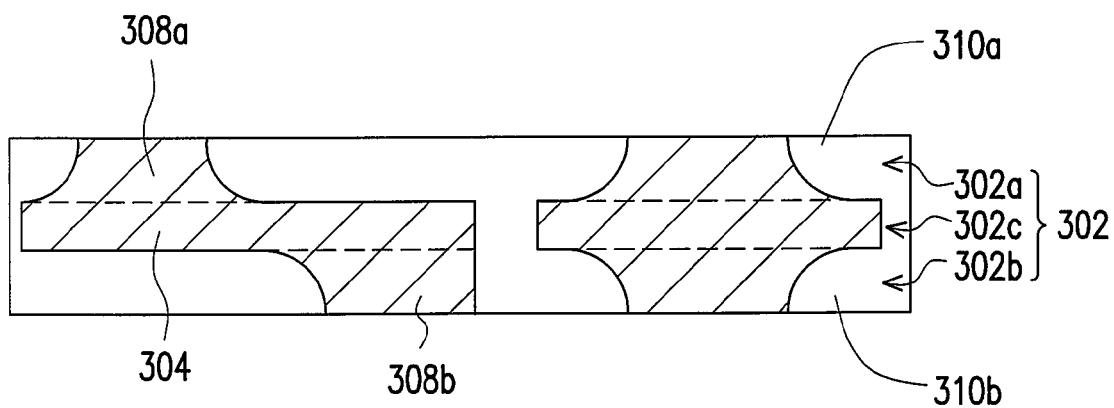
FIG. 3C is the cross-sectional view along line II-II in FIG. 3B.

FIG. 3A is a perspective view of a high thermal conducting circuit substrate of another embodiment of the present invention. FIG. 3B is the top view of the high thermal conducting circuit substrate in FIG. 3A after being assembled. FIG. 3C is the cross-sectional view along line II-II of FIG. 3B. Referring to FIGS. 3A to 3C, the high thermal conducting circuit substrate 300 is an improvement of a chip carrier for light emitting diode package fabricated according to the manufacturing process shown in FIGS. 1A to 1F, wherein the metal core substrate 302 is divided likewise into the upper layer 102a, the lower layer 102b and the middle layer 102c in FIG. 1A.

The high thermal conducting circuit substrate 300 comprises a metal core substrate 302, which is divided into a patterned upper layer 302a, a patterned lower layer 302b and a middle layer 302c stacked alternately. The middle layer 302c is disposed between the upper layer 302a and the lower layer 302b. The middle layer 302c has a plurality of traces 304, and the upper layer 302a includes a plurality of metal posts 308a, which connect respectively to a surface of the traces 304 (the upper surface), and the lower layer 302b includes a plurality of metal posts 308b, which connect respectively to another side of the traces 304 (the lower surface). One of the metal posts 308a and its corresponding metal post 308b compose a solid metal post (i.e., the conductive channel), and two ends of the solid metal post can respectively serve as a bonding pad for connecting a chip and a bonding pad for connecting the next level package or the substrate. It is noted that, in this embodiment, the metal posts 308a can be linearly arranged in a first direction, while the metal posts 308b below can correspondingly be linearly arranged in a second direction perpendicular to the first direction.

The high thermal conducting circuit substrate 300 further comprises an insulating layer 310a and another insulating layer 310b. The insulating layer 310a disposed on a surface of the upper layer 302a and complementary to the upper layer 302a. The insulating layer 310a further exposes the ends of the metal posts 308a that are farther from the middle layer 302c and serves as a plurality of bonding pads, such as chip bonding pads, flip chip bump pads or wire bonding pads. In addition, the insulating layer 310b disposed on a surface of the lower layer 302b and complementary to the lower layer 302b. Furthermore, the insulating layer 310b exposes the ends of the metal posts 308b that are farther from the middle layer 302c and serves as a plurality of bonding pads, such as power supply pads, ground pads or signal pads.

In view of the above, the manufacturing process of the high thermal conducting circuit substrate in the present invention etches a metal core substrate at different etching speeds so as to form two layers of metal patterns. Then, the negative space among the metal patterns is filled with insulating materials. Additionally, the high thermal conducting substrate of the invention mainly comprises the metal core substrate, which helps to elevate the thermal conduction of the circuit substrate itself. Hence, the high thermal conducting circuit substrate of the invention can be used to carry high power electronic elements, for instance, semiconductor integrated circuit chips or LED chips.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A manufacturing process of a high thermal conducting circuit substrate, comprising:
   providing a metal core substrate made of a metal material;
   wet etching the metal core substrate at different etching speeds, comprising:
      forming a patterned etching mask respectively on two sides of the metal core substrate, wherein each of the etching masks has a plurality of solid areas and mesh areas, whereby the mesh density of one of the mesh areas is higher than that of another one of the mesh areas;
      etching the metal core substrate by a wet etchant through the mesh areas of the etching masks, and simultaneously controlling the etching depth on the metal core substrate by controlling the mesh densities of the mesh areas; and
      removing the etching masks from the metal core substrate; and
   respectively forming an insulating layer on the two sides of the etched metal core substrate.

2. The manufacturing process claimed in claim 1, wherein the metal core substrate is etched to form a solid metal post so as to form a first bonding pad on the first surface of the metal core substrate and to form a solid metal post and a second bonding pad on the second surface of the metal core substrate, thereby forming a highly conducting thermal path from the first bonding pad to the first metal post, to the middle layer of the metal core, to the second metal post to the second bonding pad without any insulating layer in between.

3. The manufacturing process as claimed in claim 1, wherein the material of the metal core substrate is copper, aluminum or stainless steel.

4. The manufacturing process as claimed in claim 1, further comprising:
   forming respectively a conductive layer on a surface of each insulating layer.

5. The manufacturing process as claimed in claim 4, further comprising:
   patterning the conductive layers.

6. The manufacturing process as claimed in claim 4, wherein the metal core substrate is etched to form a first through hole, the first through hole penetrates through the metal core substrate, and the metal core substrate, the insulating layers and the conductive layers all constitute a laminating structure after the insulating layers and the conductive layers are formed respectively on the first surface and the second surface of the metal core substrate, the manufacturing process further comprising:
   forming a second through hole in the laminating structure, wherein the second through hole penetrates the laminating structure; and
   forming a conductive channel in the second through hole so as to electrically connect at least two layers of the groups composed of the metal core substrate and the conductive layers.

7. The manufacturing process as claimed in claim 6, wherein an electroplating process is applied to form the conductive channel 8. The manufacturing process as claimed in claim 6, further comprising:
   performing a grinding process and removing an excessive insulating material on top of metal posts and around the metal posts after a laminating step is performed so as to expose ends of the metal posts completely.

9. The manufacturing process as claimed in claim 1, wherein a first surface of the metal core substrate is etched to form at least a first bonding pad thereon.

10. The manufacturing process as claimed in claim 9, wherein the first bonding pad is used as a chip bonding pad, a flip chip bump pad or a wire bonding pad.

11. The manufacturing process as claimed in claim 9, wherein the first surface of the metal core substrate is etched to form at least a first metal post, wherein an end of the first metal post serves as a first bonding pad.

12. The manufacturing process as claimed in claim 11, further comprising:
   pre-forming openings on the insulting layers such that ends of metal posts are exposed through the insulating layers after the insulating layers are formed.

13. The manufacturing process as claimed in claim 11, wherein the first metal post is formed by etching the surrounding area of the solid mask area of the said etching mask.

14. The manufacturing process as claimed in claim 1, wherein a second surface of the metal core substrate is etched to form at least a second bonding pad thereon.

15. The manufacturing process as claimed in claim 14, wherein the second bonding pad is used as a power supply pad, a ground pad or a signal pad.

16. The manufacturing process as claimed in claim 14, wherein the second surface of the metal core substrate is etched to form at least a second metal post, wherein an end of the second metal post serves as a second bonding pad.

17. The manufacturing process as claimed in claim 16, wherein the second metal post is formed by etching the surrounding area of the solid mask area of the said etching mask.

* * * * *